US008982648B2

(12) United States Patent
Onuma et al.

(10) Patent No.: US 8,982,648 B2
(45) Date of Patent: Mar. 17, 2015

(54) SEMICONDUCTOR MEMORY DEVICE AND ANTIFUSE PROGRAMMING METHOD

(75) Inventors: Takuji Onuma, Kanagawa (JP); Kenichi Hidaka, Kanagawa (JP); Hiromichi Takaoka, Kanagawa (JP); Yoshitaka Kubota, Kanagawa (JP); Hiroshi Tsuda, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 96 days.

(21) Appl. No.: 13/193,186

(22) Filed: Jul. 28, 2011

(65) Prior Publication Data

US 2012/0026810 A1    Feb. 2, 2012

(30) Foreign Application Priority Data

Jul. 29, 2010    (JP) ................... 2010-171125

(51) Int. Cl.
  *G11C 7/00*    (2006.01)
  *G11C 17/18*   (2006.01)
(52) U.S. Cl.
  CPC ........................................ *G11C 17/18* (2013.01)
  USPC ................................... 365/189.16; 365/225.6
(58) Field of Classification Search
  None
  See application file for complete search history.

(56) References Cited

U.S. PATENT DOCUMENTS

| 5,299,151 | A | * | 3/1994 | Ishihara et al. ................. 365/96 |
| 5,363,339 | A | * | 11/1994 | Fujita ....................... 365/230.06 |
| 7,253,496 | B2 | | 8/2007 | Jenne et al. |
| 7,269,081 | B2 | | 9/2007 | Ito |
| 7,538,369 | B2 | * | 5/2009 | Kushiyama .................... 257/209 |
| 7,864,602 | B2 | | 1/2011 | Ito |
| 7,885,117 | B2 | | 2/2011 | Shin et al. |
| 2006/0291267 | A1 | * | 12/2006 | Jenne et al. ................... 365/102 |
| 2009/0262567 | A1 | * | 10/2009 | Shin et al. ........................ 365/96 |
| 2009/0284504 | A1 | | 11/2009 | Shin et al. |

FOREIGN PATENT DOCUMENTS

| JP | 2006-236511 A | 9/2006 |
| JP | 2009-259385 A | 11/2009 |
| JP | 2009-276764 A | 11/2009 |
| JP | 2009-277291 A | 11/2009 |

OTHER PUBLICATIONS

Japanese Office Action issued Oct. 1, 2013 in corresponding Japanese Patent Application No. 2010-171125.

* cited by examiner

*Primary Examiner* — James G Norman
(74) *Attorney, Agent, or Firm* — Sughrue Mion, PLLC

(57) ABSTRACT

An antifuse comprised of an NMOS transistor or an NMOS capacitor includes a first terminal coupled to a gate electrode, a second terminal coupled to a diffusion layer, and a gate insulating film interposed between the gate electrode and the diffusion layer. A programming circuit includes a first programming circuit which has first current drive capability and which performs first programming operation and a second programming circuit which has second current drive capability larger than the first current drive capability and which performs second programming operation to follow the first programming operation. In the first programming operation, the first programming circuit breaks down the gate insulating film by applying a first programming voltage between the first terminal and the second terminal. In the second programming operation, the second programming circuit applies a second programming voltage lower than the first programming voltage between the first terminal and the second terminal.

15 Claims, 8 Drawing Sheets

SEMICONDUCTOR MEMORY DEVICE AND ANTIFUSE PROGRAMMING METHOD

CROSS-REFERENCE TO RELATED APPLICATIONS

The disclosure of Japanese Patent Application No. 2010-171125 filed on Jul. 29, 2010 including the specification, drawings and abstract is incorporated herein by reference in its entirety.

BACKGROUND

The present invention relates to a semiconductor memory device having an antifuse and an antifuse programming method.

Antifuses are a known type of electrical fuses. An antifuse is typically comprised of a MOS transistor or a MOS capacitor. An antifuse is programmed by applying a high voltage between a gate electrode and diffusion layers/substrate, thereby breaking down a gate insulating film. Namely, in a programmed state, the gate electrode and the diffusion layers/substrate are short-circuited to be electrically conducted to each other. In an unprogrammed state, the gate electrode and the diffusion layers/substrate remain electrically unconductive to each other. The element is electrically off before being programmed and electrically on after being programmed, so that it is called an antifuse. Data can be read out from the antifuse by determining whether a read current (cell current) flows between the gate electrode and the diffusion layers.

Among the antifuse-related documents, there are, for example, U.S. Pat. No. 7,253,496 and Japanese Unexamined Patent Application Publications Nos. 2009-259385, 2009-276764, and 2009-277291.

SUMMARY

Concerning antifuses each comprised of an NMOS transistor or an NMOS capacitor, in particular, the inventors of the present invention have found a problem as described below with reference to FIG. 1.

FIG. 1 illustrates typical programming operation performed for an antifuse comprised of an NMOS transistor. To be more concrete, an adequately high programming voltage VPG is applied to a gate electrode, and a ground voltage is applied to n-type source and drain diffusion layers and semiconductor substrate. As a result, the gate insulating film is broken down causing the gate electrode and the diffusion layers/substrate to be short-circuited. At this time, a large current flows between the gate electrode and the diffusion layers/substrate and, as a result, a parasitic drain is formed at an end of the short-circuited portion (broken-down portion) of the gate insulating film. As the programming voltage VPG is applied to the parasitic drain, carrier electrons are generated. The carrier electrons are accelerated by a strong electric field around the parasitic drain and are possibly injected into the gate insulating film. That is, carrier electrons are possibly trapped in the gate insulating film during antifuse programming operation. Such trapping in the gate insulating film of carrier electrons is not desirable as it causes read current reduction or fluctuation at a time of reading data.

According to one aspect of the present invention, semiconductor memory device is provided which includes an antifuse comprised of an NMOS transistor or an NMOS capacitor and a programming circuit for programming the antifuse. The antifuse includes a first terminal coupled to a gate electrode, a second terminal coupled to a diffusion layer, and a gate insulating film interposed between the gate electrode and the diffusion layers. The programming circuit includes a first programming circuit which has first current drive capability and which performs first programming operation and a second programming circuit which has second current drive capability larger than the first current drive capability and which performs second programming operation to follow the first programming operation. In the first programming operation, the first programming circuit breaks down the gate insulating film by applying a first programming voltage between the first terminal and the second terminal. In the second programming operation, the second programming circuit applies a second programming voltage lower than the first programming voltage between the first terminal and the second terminal.

According to another aspect of the present invention, a method for programming an antifuse is provided. The antifuse is an NMOS transistor or an NMOS capacitor and is provided with a first terminal coupled to a gate electrode, a second terminal coupled to a diffusion layer, and a gate insulating film interposed between the gate electrode and the diffusion layer. The method for programming according to the invention includes a first step for performing first programming operation and a second step for performing second program operation to follow the first programming operation. In the first programming operation, the gate insulating film is broken down by applying, using an element having first current drive capability, a first programming voltage between the first terminal and the second terminal. In the second programming operation, a second programming voltage lower than the first programming voltage is applied, using an element having second current drive capability larger than the first current drive capability, between the first terminal and the second terminal.

According to one aspect of the present invention, when programming an antifuse, trapping of carrier electrons in a gate insulating film can be suppressed, so that read current reduction and fluctuation can be prevented at a time of reading data.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

An embodiment of the present invention will be described below with reference to the attached drawings.

1. Antifuse

Figure 2:
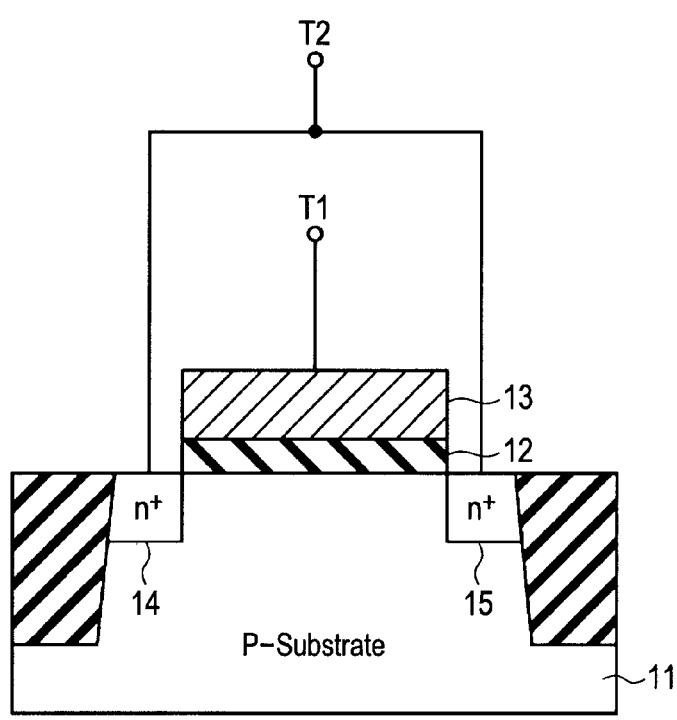
FIG. 2 is a sectional view showing an example structure of an antifuse according to an embodiment of the present invention.

FIG. 2 is a sectional view showing an example structure of an antifuse 10 according to an embodiment of the present invention. The antifuse 10 of the present embodiment is comprised of an NMOS (N-channel metal oxide semiconductor) transistor or an NMOS capacitor.

To be more concrete, the antifuse 10 includes a semiconductor substrate 11, a gate insulating film 12, a gate electrode 13, a source diffusion layer 14, a drain diffusion layer 15, a first terminal T1, and a second terminal T2. The semiconductor substrate 11 is, typically, a p-type silicon substrate. The gate electrode 13 is formed over the semiconductor substrate 11 via the gate insulating film 12. The gate electrode 13 is, typically, formed of doped polysilicon which is doped with n-type impurities such as phosphor. The source diffusion layer 14 and drain diffusion layer 15 are formed in the semiconductor substrate 11 to be on both sides of the gate electrode 13, respectively. The conductivity type of the source diffusion layer 14 and drain diffusion layer 15 is n.

In the present embodiment, the gate electrode 13 is electrically coupled to the first terminal T1. The diffusion layers 14 and 15 and the semiconductor substrate 11 are electrically coupled to the second terminal T2. The gate insulating film 12 may be said to be interposed between the first terminal T1 (gate electrode 13) and the second terminal T2 (diffusion layers 14 and 15 and semiconductor substrate 11). The antifuse 10 is programmed by breaking down the insulation of the gate insulating film 12. Namely, in a programmed state, the first terminal T1 and the second terminal T2 are short-circuited to be electrically conducted to each other. In an unprogrammed state, the first terminal T1 and the second terminal T2 are not electrically conducted to each other.

The state of the antifuse 10, i.e. data stored in the antifuse 10, can be determined based on a read current (cell current) which flows between the first terminal T1 and the second terminal T2. For example, when a read current not smaller than a predetermined threshold value flows, the antifuse 10 is in a programmed state. When the read current is smaller than the threshold value, the antifuse 10 is in an unprogrammed state. Read current reduction or fluctuation is not desirable as it causes deterioration of data reading accuracy.

According to the present embodiment, to suppress read current reduction and fluctuation, a special programming method is applied to the antifuse 10. The programming method according to the present embodiment will be described in detail below.

2. Programming Method

Figure 1:
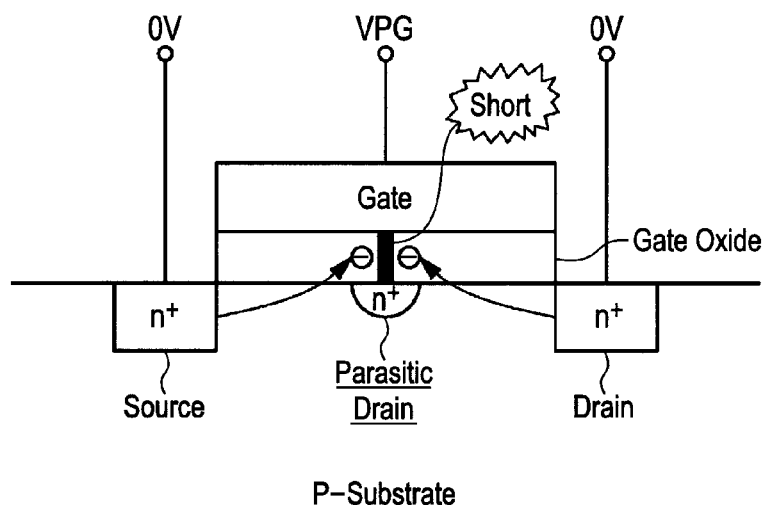
FIG. 1 is a conceptual diagram for explaining a problem involved with programming of an antifuse.
Figure 3:
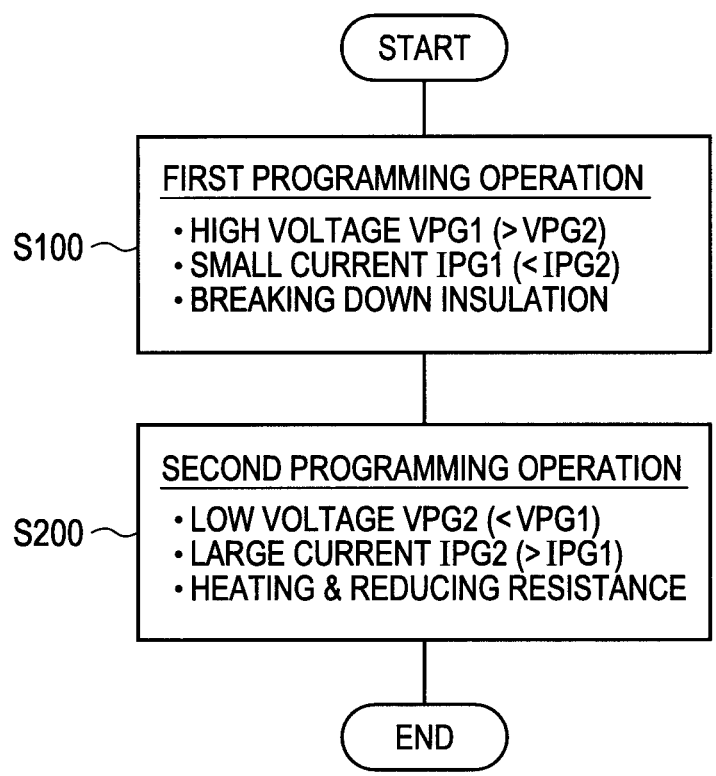
FIG. 3 is a flowchart for programming the antifuse according to the embodiment of the present invention.

FIG. 3 is a flowchart for programming the antifuse 10 according to the present embodiment. In the present embodiment, not only a high voltage is applied between the first terminal T1 and the second terminal T2, but programming is performed, as shown in FIG. 1, in two stages covering first programming operation (step S100) and second programming operation (step S200) which follows the first programming operation.

2-1. First Programming Operation (Step S100)

Figure 4:
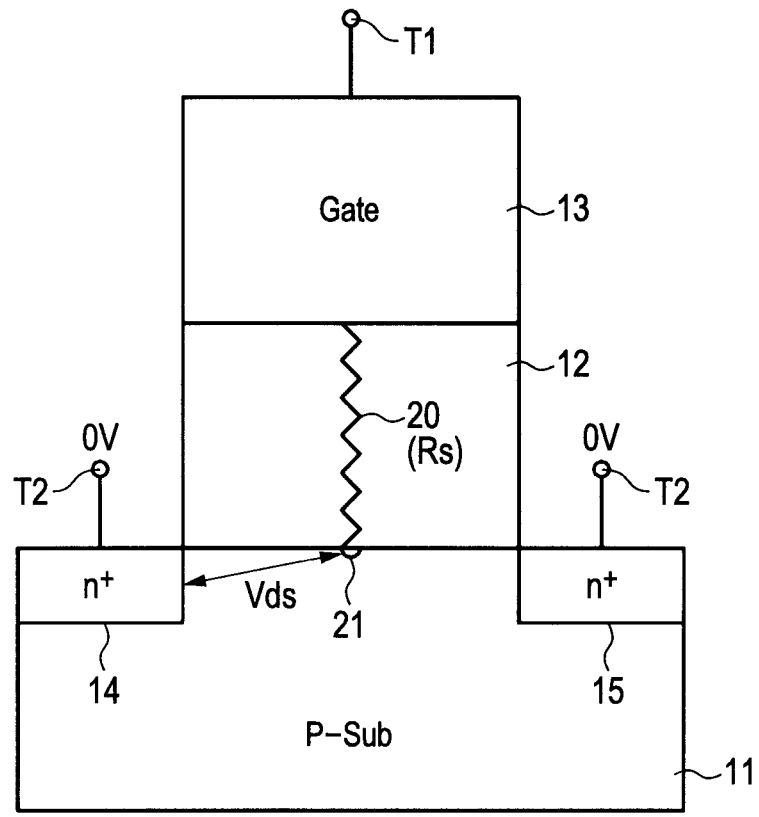
FIG. 4 is a conceptual diagram for explaining first programming operation (step S100) according to the embodiment of the present invention.

FIG. 4 is a conceptual diagram for explaining the first programming operation (step S100) according to the present embodiment. In the first programming operation, a predetermined level of voltage is applied between the first terminal T1 and the second terminal T2 by using an element having "first current drive capability IPG1." The first current drive capability IPG1 is very small, for example, 0.4 mA.

The predetermined level of voltage applied, in the first programming operation, between the first terminal T1 and the second terminal T2 is referred to as a "first programming voltage VPG1." For example, as shown in FIG. 4, the first programming voltage VPG1 is applied to the first terminal T1 and a ground voltage (0 V) is applied to the second terminal T2. The first programming voltage VPG1 is set to be adequately high. To be more concrete, the first programming voltage VPG1 is higher than a breakdown voltage required to break down the gate insulating film 12. It is, for example, 7 V. Applying the high first programming voltage VPG1 for a predetermined amount of time (e.g. 10 μs) breaks down the gate insulating film 12, causing a short-circuited portion (broken-down portion) 20 to be formed in the gate insulating film 12 as shown in FIG. 4. As a result, the gate electrode 13 is electrically conducted to the semiconductor substrate 11 and the diffusion layers 14 and 15 via the short-circuited portion 20.

In that state, n-type impurities are diffused from the gate electrode 13 (doped polysilicon) toward the semiconductor substrate 11 via the short-circuited portion 20. As a result, a parasitic drain 21 is formed in a portion, at an end of the short-circuited portion 20, of the semiconductor substrate 11.

Assume that, in the above state, a large electric current is made to flow between the first terminal T1 and the second terminal T2. The heat generated by the large current causes the short-circuited portion 20 (broken-down portion) in the gate insulating film 12 to expand and resistance Rs of the short-circuited portion 20 to reduce. When the resistance Rs of the short-circuited portion 20 reduces, voltage Vds between the source diffusion layer 14 and the short-circuited portion 20 (parasitic drain 21) becomes relatively high. In the first programming operation, in particular, with the first programming voltage VPG1 high enough to break down the gate insulating film 12 applied to the gate electrode 13, when the resistance Rs of the short-circuited portion 20 is reduced, the voltage Vds becomes very high, causing a strong electric field to be generated. As a result, carrier electrons are trapped in the gate insulating film 12 as shown in FIG. 1. Such trapping in the gate insulating film 12 of carrier electrons is not desirable as it causes read current reduction or fluctuation at a time of reading data.

In the present embodiment, to prevent such a problem, the first current drive capability IPG1 is set to be as small as possible. Namely, the first programming operation is designed not to cause a large current to flow between the first terminal T1 and the second terminal T2, so that, even though the short-circuited portion 20 (broken-down portion) is formed in the gate insulating film 12 during the first programming operation, the short-circuited portion 20 is prevented from expanding. Hence, the resistance Rs of the short-circuited portion 20 remains high, causing the voltage Vds between the source diffusion layer 14 and the short-circuited portion 20 (parasitic drain 21) to be relatively low. This suppresses trapping, as shown in FIG. 1, of carrier electrons in the gate insulating film 12.

As described above, in the first programming operation, the first programming voltage VPG1 is set to be adequately high to break down the gate insulating film 12, whereas the first current drive capability IPG1 is set to be as small as possible so as to suppress trapping of carrier electrons.

2-2. Second Programming Operation (Step S200)

To increase the read current for reading data, it is important to reduce the resistance Rs of the short-circuited portion 20 formed in the gate insulating film 12. In the second programming operation (step S200) to follow the first programming operation, the resistance of the short-circuited portion 20 is caused to reduce.

Figure 5:
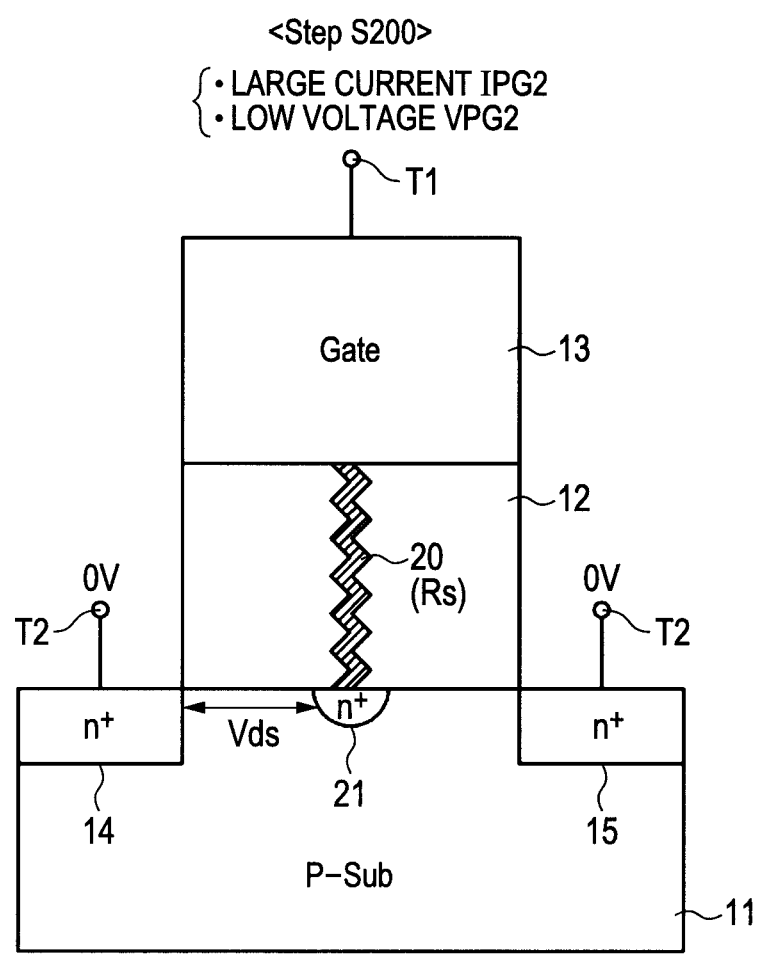
FIG. 5 is a conceptual diagram for explaining second programming operation (step S200) according to the embodiment of the present invention.

FIG. 5 is a conceptual diagram for explaining the second programming operation according to the present embodiment. In the second programming operation, a second programming voltage VPG2 is applied between the first terminal T1 and the second terminal T2 by using an element having "second current drive capability IPG2." For example, as shown in FIG. 5, the second programming voltage VPG2 is applied to the first terminal T1, and a ground voltage (0 V) is applied to the second terminal T2. The second programming voltage VPG2 is relatively low and is lower than the first programming voltage VPG1 (VPG2<VPG1). To be more concrete, the second programming voltage VPG2 is lower than a breakdown voltage required to break down the gate insulating film 12. It is, for example, 5 V.

The second current drive capability IPG2 required for the second programming operation is larger than the first current drive capability IPG1 required for the first programming operation (IPG2>IPG1). The second current drive capability IPG2 is, for example, 1.5 mA (>0.4 mA). This causes a large current to flow between the first terminal T1 and the second terminal T2. The large current generates heat to expand the short-circuited portion 20 (broken-down portion) formed in the gate insulating film 12. This reduces the resistance Rs of the short-circuited portion 20 and allows, as shown in FIG. 5, the parasitic drain 21 formed at an end of the short-circuited portion 20 to adequately expand contributing toward reducing the resistance Rs of the short-circuited portion 20.

In the case of the second programming operation, unlike in the case of the first programming operation, reduction of the resistance Rs of the short-circuited portion 20 does not cause any problem. This is because the second programming voltage. VPG2 applied between the first terminal T1 and the second terminal T2 is set to be low in the second programming operation. When the resistance Rs of the short-circuited portion 20 is reduced, the voltage Vds between the source diffusion layer 14 and the short-circuited portion 20 becomes relatively high. With the second programming voltage VPG2 set to be low, however, the absolute value of the voltage Vds does not become so large. Hence, trapping, as shown in FIG. 1, of carrier electrons in the gate insulating film 12 is suppressed.

As described above, in the second programming operation, the second current drive capability IPG2 is set to be adequately large to reduce the resistance Rs of the short-circuited portion 20, whereas the second programming voltage VPG2 is set to be as low as possible so as to suppress trapping of carrier electrons.

2-3. Effects

As described above, according to the present embodiment, programming of the antifuse 10 is performed in two stages covering the first programming operation and the second programming operation, respectively. In the first programming operation, the first programming voltage VPG1 is set to be adequately high to break down the gate insulating film 12, whereas the first current drive capability IPG1 is set to be as small as possible so as to suppress trapping of carrier electrons. In the second programming operation to follow the first programming operation, the second current drive capability IPG2 is set to be adequately large to reduce the resistance Rs of the short-circuited portion 20, whereas the second programming voltage VPG2 is set to be as low as possible so as to suppress trapping of carrier electrons. In this way, it is possible, while suppressing trapping of carrier electrons, to appropriately break down the gate insulating film 12 and secure an adequately large read current. Furthermore, as trapping of carrier electrons in the gate insulating film 12 is suppressed, read current fluctuation and reduction can also be suppressed.

3. Circuit Configuration

Figure 6:
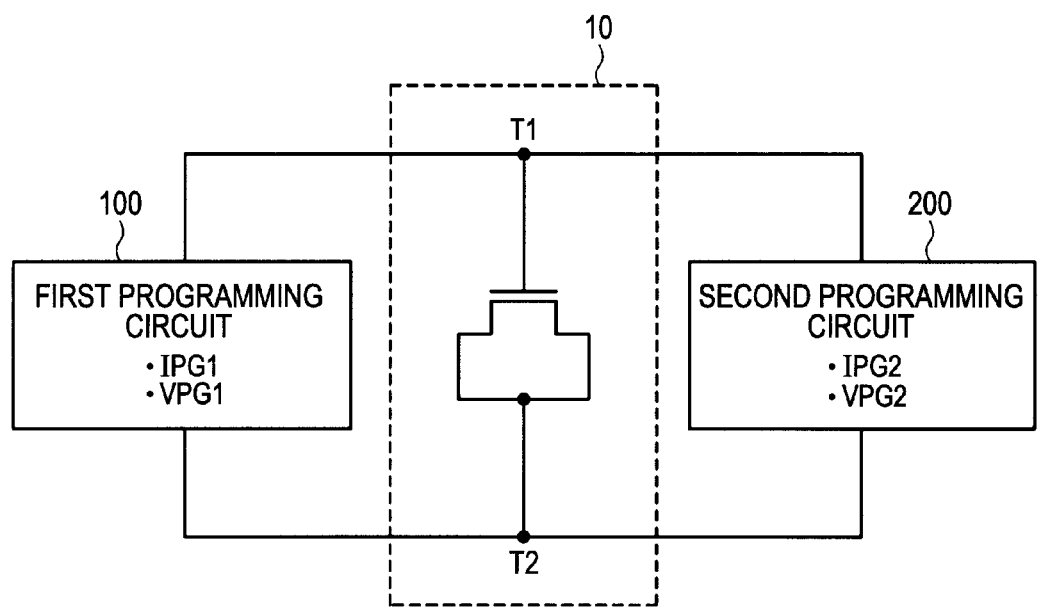
FIG. 6 is a block diagram showing the configuration of a semiconductor memory device according to the embodiment of the present invention.

FIG. 6 is a block diagram showing the configuration of a semiconductor memory device 1 according to the present embodiment. The semiconductor memory device 1 is configured to realize the foregoing programming method. To be more concrete, the semiconductor memory device 1 includes the antifuse 10, a first programming circuit 100, and a second programming circuit 200. The first programming circuit 100 and the second programming circuit 200 are coupled to the antifuse 10 and program the antifuse 10.

The first programming circuit 100 performs the first programming operation (step S100). Namely, the first programming circuit 100 has the first current drive capability IPG1. In the first programming operation, the first programming circuit 100 applies the first programming voltage VPG1 between the first terminal T1 and the second terminal T2 and, thereby, breaks down the gate insulating film 12.

The second programming circuit 200, on the other hand, performs the second programming operation (step S200). Namely, the second programming circuit 200 has the second current drive capability IPG2. In the second programming operation, the second programming circuit 200 applies the second programming voltage VPG2 between the first terminal T1 and the second terminal T2.

Figure 7:
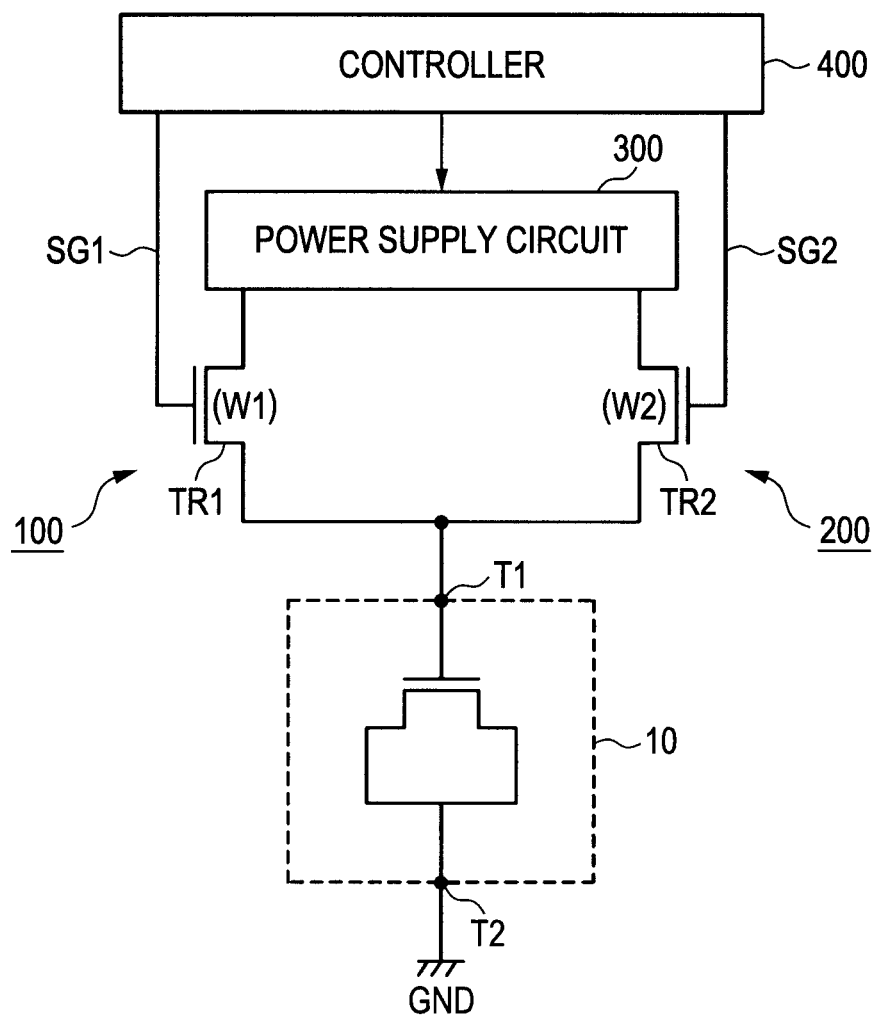
FIG. 7 shows an example circuit configuration of the semiconductor memory device according to the embodiment of the present invention.

FIG. 7 shows an example circuit configuration of the semiconductor memory device 1 according to the present embodiment. As shown in FIG. 7, the first programming circuit 100 includes a first transistor TR1, and the second program circuit 200 includes a second transistor TR2. The first transistor TR1 and the second transistor TR2 differ in current drive capability. To be more concrete, the first transistor TR1 has the first current drive capability IPG1, and its gate width is a first gate width W1. The second transistor TR2 has the second current drive capability IPG2 that is larger than the first current drive capability IPG1, and its gate width is a second gate width W2 that is wider than the first gate width W1 (W2>W1).

In the example shown in FIG. 7, the first and second transistors TR1 and TR2 are coupled, in parallel, to the first terminal T1. To be more concrete, the first and second transistors TR1 and TR2 are PMOS transistors with their drains commonly coupled to the first terminal T1. The source of each of the first and second transistors TR1 and TR2 is coupled to a power supply circuit 300. The gate of each of the first and second transistors TR1 and TR2 is coupled to a controller 400. The second terminal T2 is coupled to a ground line (GND).

The controller 400 outputs a first gate control signal SG1 to the gate of the first transistor TR1 to turn the first transistor TR1 on/off. The controller 400 also outputs a second gate control signal SG2 to the gate of the second transistor TR2 to turn the second transistor TR2 on/off. Furthermore, the controller 400 controls the output voltage of the power circuit 300. The power supply circuit 300 outputs, under the control of the controller 400, the first programming voltage VPG1 or the second programming voltage VPG2.

In the first programming operation, the controller 400 turns the first transistor TR1 on and the second transistor TR2 off.

The power supply circuit 300 outputs the first programming voltage VPG1. This causes the first programming voltage VPG1 to be applied to the first terminal T1 via the first transistor TR1. Namely, the first programming voltage VPG1 is applied between the first terminal T1 and the second terminal T2 via the first transistor TR1 having the first current drive capability IPG1. The first transistor TR1, the ground line, the power supply circuit 300, and the controller 400 combined are equivalent to the first programming circuit 100.

In the second programming operation, the controller 400 turns the second transistor TR2 on and the first transistor TR1 off. The power supply circuit 300 outputs the second programming voltage VPG2. This causes the second programming voltage VPG2 to be applied to the first terminal T1 via the second transistor TR2. Namely, the second programming voltage VPG2 is applied between the first terminal T1 and the second terminal T2 via the second transistor TR2 having the second current drive capability IPG2. The second transistor TR2, the ground line, the power supply circuit 300, and the controller 400 combined are equivalent to the second programming circuit 200.

Figure 8:
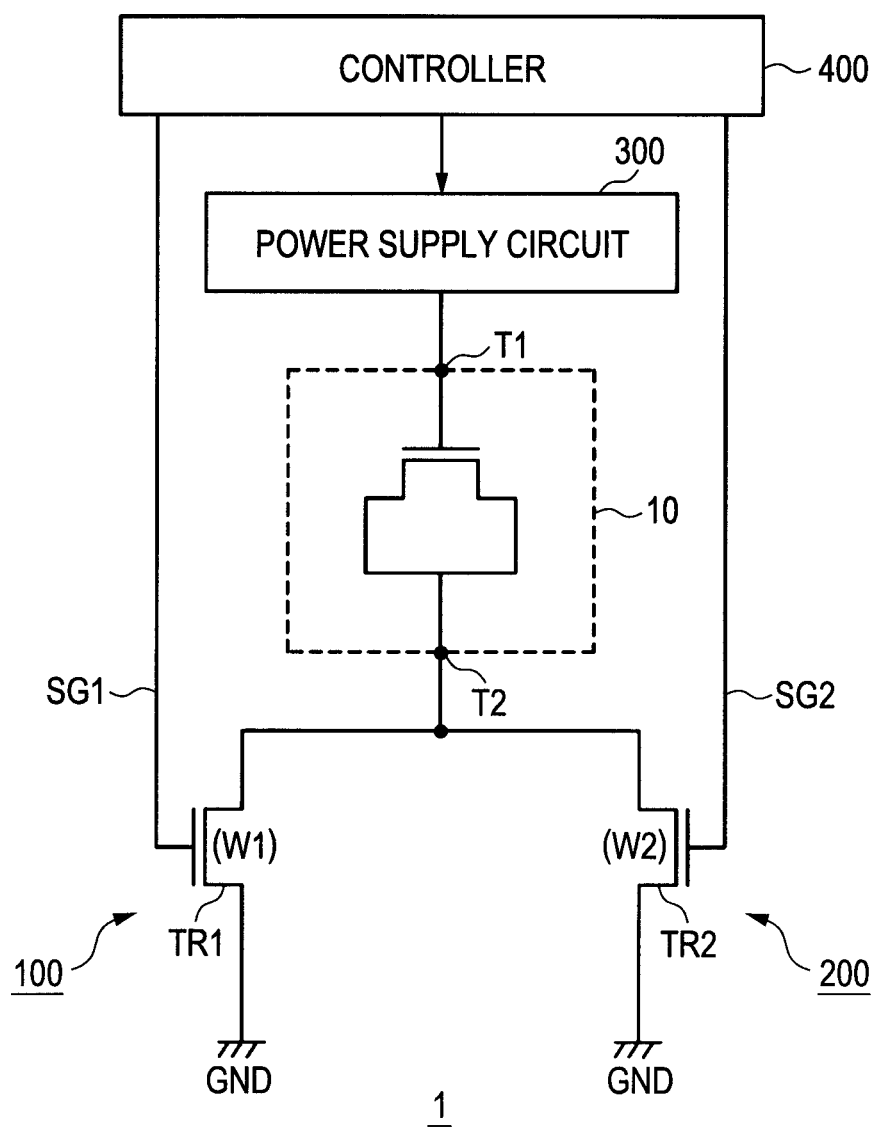
FIG. 8 shows another example circuit configuration of the semiconductor memory device according to the embodiment of the present invention.

FIG. 8 shows another example circuit configuration of the semiconductor memory device 1 according to the present embodiment. In the following, description to overlap the foregoing description provided with reference to FIG. 7 will be omitted as considered appropriate. In the example shown in FIG. 8, the first and second transistors TR1 and TR2 are coupled in parallel between the second terminal T2 and ground (GND). To be more concrete, the first and second transistors TR1 and TR2 are NMOS transistors with their drains commonly coupled to the second terminal T2. The source of each of the first and second transistors TR1 and TR2 is coupled to ground. The gate of each of the first and second transistors TR1 and TR2 is coupled to the controller 400. The first terminal T1 is directly coupled to the power supply circuit 300.

In the first programming operation, the controller 400 turns the first transistor TR1 on and the second transistor TR2 off. The power supply circuit 300 outputs the first programming voltage VPG1. This causes the first programming voltage VPG1 to be applied to the first terminal T1. In this case, too, the first programming voltage VPG1 is applied between the first terminal T1 and the second terminal T2 via the first transistor TR1 having the first current drive capability IPG1.

In the second programming operation, the controller 400 turns the second transistor TR2 on and the first transistor TR1 off. The power supply circuit 300 outputs the second programming voltage VPG2. This causes the second programming voltage VPG2 to be applied to the first terminal T1. In this case, too, the second programming voltage VPG2 is applied between the first terminal T1 and the second terminal T2 via the second transistor TR2 having the second current drive capability IPG2.

Figure 9:
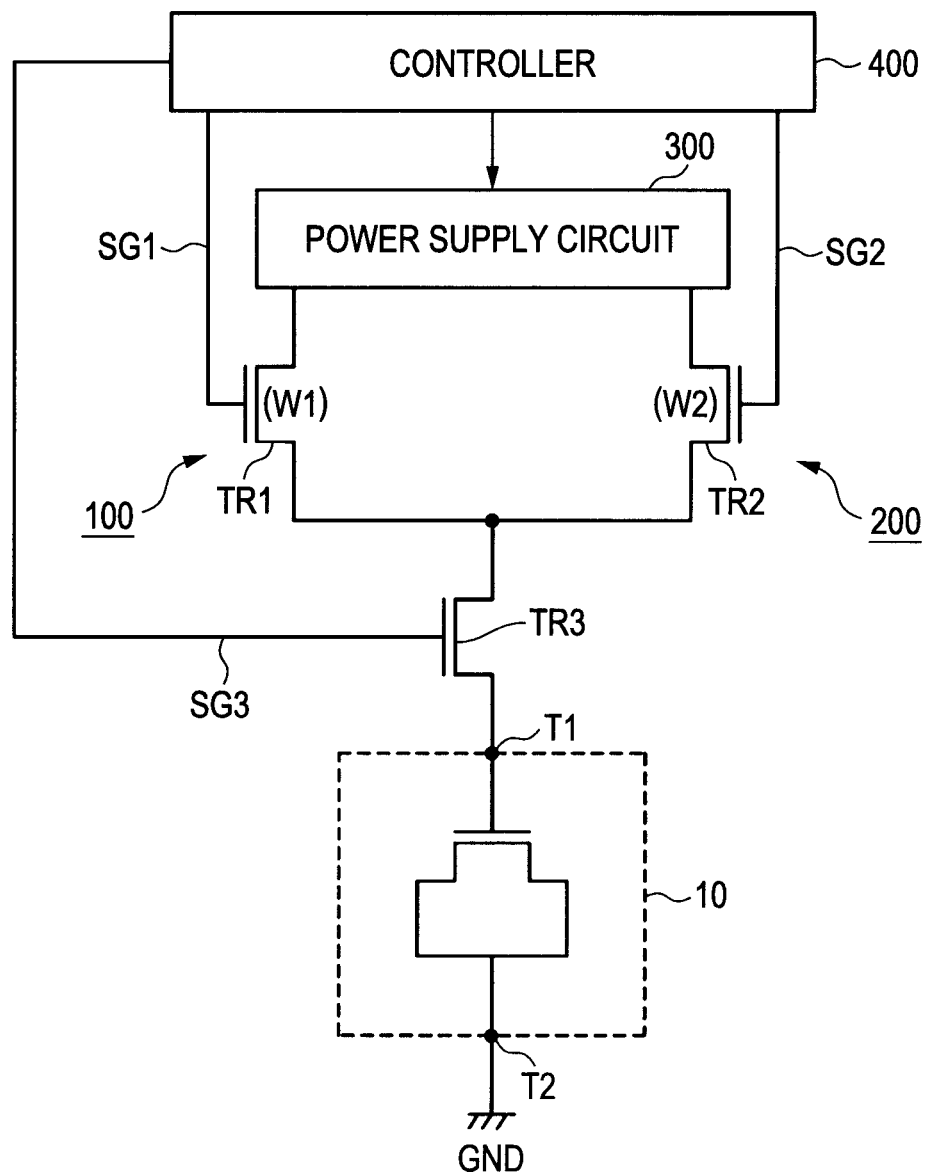
FIG. 9 shows still another example circuit configuration of the semiconductor memory device according to the embodiment of the present invention.

FIG. 9 shows still another example circuit configuration of the semiconductor memory device 1 according to the present embodiment. In the following, description to overlap the foregoing description provided with reference to FIG. 7 will be omitted as considered appropriate. The first terminal T1 is coupled, via a third transistor TR3, to the first transistor TR1 and the second transistor TR2. The controller 400 outputs a third gate control signal SG3 to the gate of the third transistor TR3 and turns the third transistor TR3 on/off. The third transistor TR3 is turned on in both the first programming operation and the second programming operation. In other respects, the circuit shown in FIG. 9 is equivalent to the circuit shown in FIG. 7.

Although the present invention has been described in connection with a preferred embodiment with reference to the attached drawings, the invention is not restricted to the embodiment and various changes and modifications can be made by those skilled in the art without departing from the scope of the invention.

What is claimed is:

1. A semiconductor memory device comprising:
   an antifuse which is an NMOS transistor or an NMOS capacitor; and
   a programming circuit which programs the antifuse,
   the antifuse including:
      a first terminal coupled to a gate electrode;
      a second terminal coupled to a diffusion layer; and
      a gate insulating film interposed between the gate electrode and the diffusion layer; and
   the programming circuit including:
      a first programming circuit which has first current drive capability and which performs first programming operation, the first programming circuit includes a first transistor which has a first gate width and the first current drive capability; and
      a second programming circuit which has second current drive capability larger than the first current drive capability and which performs second programming operation to follow the first programming operation, the second programming circuit includes a second transistor which has a second gate width wider than the first gate width and the second current drive capability,
   wherein, in the first programming operation, the first programming circuit turns the first transistor on, and breaks down the gate insulating film by applying, via the first transistor, a first programming voltage between the first terminal and the second terminal; and
   wherein, in the second programming operation, the second programming circuit turns the second transistor on, and applies, via the second transistor, a second programming voltage lower than the first programming voltage between the first terminal and the second terminal.

2. The semiconductor memory device according to claim 1, wherein the first programming voltage is higher than a breakdown voltage required to break down the gate insulating film and the second programming voltage is lower than the breakdown voltage.

3. The semiconductor memory device according to claim 1,
   wherein the first transistor and the second transistor are coupled in parallel between the second terminal and ground,
   wherein, in the first programming operation, the second transistor is turned off and the first programming circuit applies the first programming voltage to the first terminal, and
   wherein, in the second programming operation, the first transistor is turned off and the second programming circuit applies the second programming voltage to the first terminal.

4. The semiconductor memory device according to claim 1, wherein the first transistor and the second transistor are coupled in parallel to the first terminal.

5. The semiconductor memory device according to claim 4, wherein the second terminal is coupled to ground.

6. The semiconductor memory device according to claim 1, wherein the antifuse includes an NMOS transistor.

7. The semiconductor memory device according to claim 1, wherein the antifuse includes an NMOS capacitor.

8. A semiconductor memory device comprising:
an antifuse which is an NMOS transistor or an NMOS capacitor; and
a programming circuit which programs the antifuse,
the antifuse including:
   a first terminal couple to a gate electrode;
   a second terminal coupled to a diffusion layer; and
   a gate insulating film interposed between the gate electrode and the diffusion layer; and
the programming circuit including:
   a first programming circuit which has first current drive capability and which performs first programming operation, the first programming circuit includes a first transistor which has a first gate width and the first current drive capability; and
   a second programming circuit which has second current drive capability larger than the first current drive capability and which performs second. programming operation to follow the first programming operation, the second programming circuit includes a second transistor which has a second gate width wider than the first gate width and the second current drive capability,
wherein, in the first programming operation, the first programming circuit turns the first transistor on, and breaks down the gate insulating film by applying, via the first transistor, a first programming voltage between the first terminal and the second terminal,
wherein, in the second programming operation, the second programming circuit turns the second transistor on, and applies, via the second transistor, a second programming voltage lower than the first programming voltage between the first terminal and the second terminal,
wherein the first transistor and the second transistor are coupled in parallel to the first terminal and the second terminal is coupled to ground,
wherein, in the first programming operation, the second transistor is turned off and the first programming circuit applies the first programming voltage to the first terminal via the first transistor, and
wherein, in the second programming operation, the first transistor is turned off and the second programming circuit applies the second programming voltage to the first terminal via the second transistor.

9. A method for programming an antifuse by using a programming circuit, the antifuse being an NMOS transistor or an NMOS capacitor and having a first terminal coupled to a gate electrode, a second terminal coupled to a diffusion layer, and a gate insulating film interposed between the gate electrode and the diffusion layer, the programming circuit including a first programming circuit and a second programming circuit, the first programming circuit has a first current drive capability, performs a first programming operation, and includes a first transistor which has a first gate width and the first current drive capability, the second programming circuit has a second current drive capability larger than the first current drive capability, performs a second programming operation, and includes a second transistor which has a second gate width wider than the first gate width and the second current drive capability, the method for programming comprising:
   performing, using the first programming circuit, a first programming operation that includes breaking down the gate insulating film by applying, via the first transistor, a first programming voltage between the first terminal and the second terminal; and
   performing, using the second programming circuit, a second programming operation following the first programming operation, the second programming operation including applying, via the second transistor, a second programming voltage lower than the first programming voltage between the first terminal and the second terminal.

10. The method for programming an antifuse according to claim 6, wherein performing the first programming operation includes applying a first current between the first terminal and the second terminal, and performing the second programming operation includes applying a second current between the first terminal and the second terminal.

11. The method for programming an antifuse according to claim 10, wherein the first current is less than the second current.

12. The method for programming an antifuse according to claim 9, wherein the first programming voltage is higher than a breakdown voltage required to break down the gate insulating film and the second programming voltage is lower than the breakdown voltage.

13. The method for programming an antifuse according to claim 9, wherein the second programming operation decreases a resistance of the broken down gate insulating film.

14. The method for programming an antifuse according to claim 9, wherein the second programming operation decreases a resistance of the broken down gate insulating film.

15. The method for programming an antifuse according to claim 9, wherein the first programming operation creates a parasitic drain, and the second programming operation increases a size of the parasitic drain.

* * * * *

UNITED STATES PATENT AND TRADEMARK OFFICE
CERTIFICATE OF CORRECTION

| | |
|---|---|
| PATENT NO. | : 8,982,648 B2 |
| APPLICATION NO. | : 13/193186 |
| DATED | : March 17, 2015 |
| INVENTOR(S) | : Takuji Onuma et al. |

Page 1 of 1

It is certified that error appears in the above-identified patent and that said Letters Patent is hereby corrected as shown below:

In the claims

Column 9, Line 6: In Claim 8, delete "couple" and insert -- coupled --

Column 9, Line 18: In Claim 8, delete "second." and insert -- second --

Column 10, Line 25: In Claim 10, delete "claim 6," and insert -- claim 9, --

Signed and Sealed this
Twenty-ninth Day of December, 2015

Michelle K. Lee
*Director of the United States Patent and Trademark Office*